(12) United States Patent
Allen et al.

(10) Patent No.: US 10,746,374 B2
(45) Date of Patent: Aug. 18, 2020

(54) NEARLY INDEX-MATCHED LUMINESCENT GLASS-PHOSPHOR COMPOSITES FOR PHOTONIC APPLICATIONS

(71) Applicant: Quarkstar LLC, Las Vegas, NV (US)

(72) Inventors: Steven C. Allen, Beverly, MA (US); Andrew J. Steckl, Cincinnati, OH (US)

(73) Assignee: Quarkstar LLC, Las Vegas, NV (US)

( * ) Notice: Subject to any disclaimer, the term of this patent is extended or adjusted under 35 U.S.C. 154(b) by 0 days.

(21) Appl. No.: 15/965,793

(22) Filed: Apr. 27, 2018

(65) Prior Publication Data

US 2019/0101261 A1   Apr. 4, 2019

Related U.S. Application Data

(63) Continuation of application No. 15/236,127, filed on Aug. 12, 2016, now abandoned, which is a (Continued)

(51) Int. Cl.
*H01L 33/50* (2010.01)
*C09K 11/08* (2006.01)
(Continued)

(52) U.S. Cl.
CPC .............. *F21V 3/08* (2018.02); *C03C 3/0745* (2013.01); *C03C 4/12* (2013.01); *C09K 11/025* (2013.01);
(Continued)

(58) Field of Classification Search
CPC ....... H01L 33/507; H01L 33/502; F21V 3/08; F21V 3/061; H05B 33/12
See application file for complete search history.

(56) References Cited

U.S. PATENT DOCUMENTS 3,960,579 A   6/1976   Broerner
4,038,448 A   7/1977   Boyd et al.
(Continued)

FOREIGN PATENT DOCUMENTS

CN   101832529 A   9/2010
JP   2006-352030   12/2006
(Continued)

OTHER PUBLICATIONS

Allen, et al. "A nearly ideal phosphor-converted white light-emitting diode", Applied Physics Letters, vol. 92 (2008) 3 pages.
(Continued)

*Primary Examiner* — Karabi Guharay
(74) *Attorney, Agent, or Firm* — Fish & Richardson P.C.

(57) ABSTRACT

A light emitting device includes a light emitting diode (LED); a transparent optic having a refractive index $n_{optic}$; and a phosphor layer spaced apart from the LED and positioned between the LED and the transparent optic. The phosphor layer has an effective refractive index $n_{phosphor}$, where a gap between the LED and the phosphor layer has a refractive index $n_{gap}$ that is less than $n_{phosphor}$. The transparent optic has an inner convex surface in contact with the phosphor layer. The inner convex surface has an inner radius of curvature r; and an outer convex surface facing away from the phosphor layer and being a surface through which the light emitting device emits light into a medium adjacent the outer convex surface. The medium has a refractive index $n_{medium}$. The outer convex surface has an outer radius of curvature R, such that r/R is equal to $n_{medium}/n_{optic}$.

12 Claims, 7 Drawing Sheets

Related U.S. Application Data continuation of application No. 14/792,501, filed on Jul. 6, 2015, now Pat. No. 9,420,664, which is a continuation of application No. 14/444,829, filed on Jul. 28, 2014, now Pat. No. 9,078,332, which is a continuation of application No. 13/794,060, filed on Mar. 11, 2013, now Pat. No. 8,791,631, which is a continuation of application No. 12/669,579, filed as application No. PCT/US2008/070621 on Jul. 21, 2008, now abandoned.

(60) Provisional application No. 60/961,185, filed on Jul. 19, 2007.

(51) Int. Cl.

| | | |
|---|---|---|
| *F21V 3/08* | (2018.01) | |
| *H05B 33/12* | (2006.01) | |
| *H05B 33/02* | (2006.01) | |
| *H05B 33/14* | (2006.01) | |
| *H05B 33/22* | (2006.01) | |
| *F21K 9/66* | (2016.01) | |
| *F21V 3/06* | (2018.01) | |
| *C03C 3/074* | (2006.01) | |
| *C03C 4/12* | (2006.01) | |
| *C09K 11/02* | (2006.01) | |
| *F21V 5/00* | (2018.01) | |
| *F21V 7/05* | (2006.01) | |
| *F21V 13/04* | (2006.01) | |
| *F21Y 115/30* | (2016.01) | |
| *F21Y 115/10* | (2016.01) | |

(52) U.S. Cl.
CPC ............... *C09K 11/08* (2013.01); *F21K 9/66* (2016.08); *F21V 3/061* (2018.02); *F21V 5/00* (2013.01); *F21V 7/05* (2013.01); *F21V 13/04* (2013.01); *H01L 33/507* (2013.01); *H05B 33/02* (2013.01); *H05B 33/12* (2013.01); *H05B 33/145* (2013.01); *H05B 33/22* (2013.01); *C03C 2204/00* (2013.01); *F21Y 2115/10* (2016.08); *F21Y 2115/30* (2016.08); *H01L 33/502* (2013.01)

(56) References Cited

U.S. PATENT DOCUMENTS

| | | | |
|---|---|---|---|
| 4,240,692 A | 12/1980 | Winston | |
| 4,301,461 A | 11/1981 | Asano | |
| 4,374,749 A | 2/1983 | Cusano et al. | |
| 4,389,118 A | 6/1983 | Yuasa et al. | |
| 4,797,609 A | 1/1989 | Yang | |
| 4,907,044 A | 3/1990 | Schellhorn et al. | |
| 5,001,609 A | 3/1991 | Gardner et al. | |
| 5,055,892 A | 10/1991 | Gardner et al. | |
| 5,268,635 A | 12/1993 | Bortolini et al. | |
| 5,282,088 A | 1/1994 | Davidson | |
| 5,331,393 A * | 7/1994 | Hopkins | G01M 11/064 356/121 |
| 5,335,152 A | 8/1994 | Winston | |
| 5,424,855 A | 6/1995 | Nakamura et al. | |
| 5,727,108 A | 3/1998 | Hed | |
| 5,856,727 A | 1/1999 | Schroeder et al. | |
| 6,066,861 A | 5/2000 | Hohn | |
| 6,095,655 A | 8/2000 | Bigliati et al. | |
| 6,111,367 A | 8/2000 | Asano et al. | |
| 6,155,699 A | 12/2000 | Miller et al. | |
| 6,236,331 B1 | 5/2001 | Dussureault | |
| 6,479,942 B2 | 11/2002 | Kimura | |
| 6,495,964 B1 | 12/2002 | Muthu et al. | |
| 6,527,411 B1 | 3/2003 | Sayers | |
| 6,617,560 B2 | 9/2003 | Forke | |
| 6,642,618 B2 | 11/2003 | Yagi et al. | |
| 6,819,505 B1 | 11/2004 | Cassarly et al. | |
| 7,015,514 B2 | 3/2006 | Baur et al. | |
| 7,091,653 B2 | 8/2006 | Ouderkirk et al. | |
| 7,151,283 B2 | 12/2006 | Reeh et al. | |
| 7,286,296 B2 | 10/2007 | Chaves et al. | |
| 7,306,960 B2 | 12/2007 | Bogner et al. | |
| 7,329,907 B2 | 2/2008 | Pang | |
| 7,329,998 B2 | 2/2008 | Jungwirth | |
| 7,344,902 B2 | 3/2008 | Basin et al. | |
| 7,355,284 B2 | 4/2008 | Negley | |
| 7,514,867 B2 | 4/2009 | Yano et al. | |
| 7,522,802 B2 | 4/2009 | Shiau et al. | |
| 7,828,453 B2 | 11/2010 | Tran et al. | |
| 7,859,190 B2 | 12/2010 | Shi | |
| 7,889,421 B2 | 2/2011 | Narendran et al. | |
| 8,007,118 B2 | 8/2011 | O'Neill et al. | |
| 8,083,364 B2 | 12/2011 | Allen | |
| 8,168,998 B2 | 5/2012 | David et al. | |
| 8,314,537 B2 | 11/2012 | Gielen et al. | |
| 8,362,695 B2 | 1/2013 | Aanegola et al. | |
| 8,436,380 B2 | 5/2013 | Aanegola et al. | |
| 8,598,778 B2 | 12/2013 | Allen et al. | |
| 8,791,631 B2 | 7/2014 | Allen et al. | |
| 9,078,332 B2 | 7/2015 | Allen | |
| 9,441,818 B2 | 9/2016 | Dixon et al. | |
| 9,482,396 B2 | 11/2016 | Dixon et al. | |
| 9,494,293 B2 | 11/2016 | Pickard | |
| 9,683,710 B2 | 6/2017 | Schinagl | |
| 9,822,951 B2 | 11/2017 | Lu et al. | |
| 10,107,475 B2 | 10/2018 | Smith et al. | |
| 2003/0117087 A1 | 6/2003 | Barth et al. | |
| 2003/0235050 A1 | 12/2003 | West et al. | |
| 2004/0051111 A1 | 3/2004 | Ota | |
| 2004/0052076 A1 | 3/2004 | Mueller et al. | |
| 2004/0120155 A1 | 6/2004 | Suenaga | |
| 2004/0150991 A1 | 8/2004 | Ouderkirk et al. | |
| 2004/0223315 A1 | 11/2004 | Suehiro et al. | |
| 2005/0023545 A1 | 2/2005 | Camras et al. | |
| 2005/0075234 A1 | 4/2005 | Wolff et al. | |
| 2005/0127833 A1 | 6/2005 | Tieszen | |
| 2005/0185416 A1 | 8/2005 | Lee et al. | |
| 2005/0243570 A1 | 11/2005 | Chaves et al. | |
| 2005/0269582 A1 | 12/2005 | Mueller et al. | |
| 2006/0097245 A1 | 5/2006 | Aanegola et al. | |
| 2006/0126343 A1 | 6/2006 | Hsieh et al. | |
| 2006/0152140 A1 | 7/2006 | Brandes | |
| 2006/0152931 A1 | 7/2006 | Holman | |
| 2006/0255353 A1 | 11/2006 | Taskar et al. | |
| 2007/0018102 A1 | 1/2007 | Braune et al. | |
| 2007/0081336 A1 | 4/2007 | Bierhuizen et al. | |
| 2007/0170447 A1 | 7/2007 | Negley | |
| 2007/0256453 A1 | 11/2007 | Barnes et al. | |
| 2007/0257267 A1 | 11/2007 | Leatherdale et al. | |
| 2007/0273282 A1 | 11/2007 | Radkov et al. | |
| 2008/0054280 A1 | 3/2008 | Reginelli et al. | |
| 2008/0079910 A1 | 4/2008 | Rutherford et al. | |
| 2008/0080166 A1 | 4/2008 | Duong et al. | |
| 2008/0101754 A1 | 5/2008 | Parker et al. | |
| 2008/0112183 A1 | 5/2008 | Negley | |
| 2008/0297027 A1 | 12/2008 | Miller et al. | |
| 2009/0008662 A1 | 1/2009 | Ashdown | |
| 2009/0050919 A1 | 2/2009 | Weijers et al. | |
| 2009/0200939 A1 | 8/2009 | Lenk et al. | |
| 2009/0201677 A1 | 8/2009 | Hoelen et al. | |
| 2009/0272996 A1 | 11/2009 | Chakraborty | |
| 2009/0296407 A1 | 12/2009 | Bailey | |
| 2009/0310352 A1 | 12/2009 | Chang | |
| 2010/0066236 A1 | 3/2010 | Xu et al. | |
| 2010/0073927 A1 | 3/2010 | Lewin et al. | |
| 2010/0097821 A1 | 4/2010 | Huang et al. | |
| 2010/0123386 A1 | 5/2010 | Chen | |
| 2010/0134016 A1 | 6/2010 | York et al. | |
| 2010/0148151 A1 | 6/2010 | Camras et al. | |
| 2010/0172120 A1 | 7/2010 | Wegh et al. | |
| 2010/0232134 A1 | 9/2010 | Tran | |
| 2010/0263723 A1 | 10/2010 | Allen et al. | |
| 2010/0264432 A1 | 10/2010 | Liu et al. | |
| 2010/0290226 A1 | 11/2010 | Harbers et al. | |

(56) References Cited

U.S. PATENT DOCUMENTS

| | | | |
|---|---|---|---|
| 2010/0301367 | A1 | 12/2010 | Nakamura et al. |
| 2010/0301727 | A1 | 12/2010 | Lenk et al. |
| 2010/0308354 | A1 | 12/2010 | David et al. |
| 2011/0080108 | A1 | 4/2011 | Chiang et al. |
| 2011/0089817 | A1 | 4/2011 | Lyons et al. |
| 2011/0176091 | A1 | 7/2011 | Boonekamp et al. |
| 2011/0182065 | A1 | 7/2011 | Negley et al. |
| 2011/0227037 | A1 | 9/2011 | Su |
| 2011/0267800 | A1 | 11/2011 | Tong et al. |
| 2011/0267801 | A1 | 11/2011 | Tong et al. |
| 2011/0273882 | A1 | 11/2011 | Pickard |
| 2011/0291130 | A1 | 12/2011 | Diana et al. |
| 2011/0298371 | A1 | 12/2011 | Brandes et al. |
| 2012/0033403 | A1 | 2/2012 | Lamvik et al. |
| 2012/0039073 | A1 | 2/2012 | Tong |
| 2012/0068205 | A1 | 3/2012 | Galvez et al. |
| 2012/0112219 | A1 | 5/2012 | Jang et al. |
| 2012/0112661 | A1 | 5/2012 | Van de Ven et al. |
| 2012/0119221 | A1 | 5/2012 | Negley |
| 2012/0127694 | A1 | 5/2012 | Richardson |
| 2012/0140436 | A1 | 6/2012 | Yang et al. |
| 2012/0147296 | A1 | 6/2012 | Montgomery et al. |
| 2012/0181565 | A1 | 7/2012 | David et al. |
| 2012/0187441 | A1 | 7/2012 | Li |
| 2012/0287602 | A1 | 11/2012 | Urano |
| 2012/0327656 | A1 | 12/2012 | Ramer et al. |
| 2013/0021776 | A1 | 1/2013 | Veerasamy et al. |
| 2013/0201715 | A1 | 8/2013 | Dau et al. |
| 2014/0333198 | A1 | 11/2014 | Allen et al. |
| 2015/0241029 | A1 | 8/2015 | York |

FOREIGN PATENT DOCUMENTS

| | | |
|---|---|---|
| JP | 2007-49019 | 2/2007 |
| JP | 2007053366 A | 3/2007 |
| JP | 2007157686 A | 6/2007 |
| JP | 2009-177095 | 8/2009 |
| JP | 2010206085 A | 9/2010 |
| JP | 2009510764 A | 1/2012 |
| WO | WO01/07828 | 2/2001 |
| WO | WO 01/27962 | 4/2001 |
| WO | WO03/017729 | 2/2003 |
| WO | WO04/076916 | 9/2004 |
| WO | WO2007037662 | 4/2007 |
| WO | WO2007081812 | 7/2007 |
| WO | 2009145298 A | 12/2009 |
| WO | 2010067292 A | 6/2010 |
| WO | PCT/IB2011/052874 | 6/2011 |
| WO | WO2011112914 | 9/2011 |
| WO | WO 2013/078463 | 5/2013 |

OTHER PUBLICATIONS

Allen, et al. "ELiXIR—Solid-State Luminaire With Enhanced Light Extraction by Internal Reflection", Journal of Display Technology, vol. 3, No. 2, Jun. 2007 pp. 155-159.

Allen, et al., "Highly Efficient light-emitting composite material for solid-state illumination devices, lasers, and luminescent collectors", U.S. Appl. No. 60/961,185, filed Jul. 19, 2007, 38 pages.

Carclo Technical Plastics "Luxeon® I 20 & 26.5mm Range", downloaded from the internet at: http://docs-europe.electrocomponents.com/webdocs/0dcb/0900766b80dcbbeb.pdf on Oct. 30, 2012, 31 pages.

Intematix, "Design Considerations for ChromaLit™ Ellipse, Candle, and Dome Remote Phosphor Light Sources", Jan. 11, 2012, downloaded from the internet at: http://www.intematix.com/uploads/files/imx-design-consideratious-ecd-app-note.pdf, on Oct. 30, 2012, 23 pages.

Intematix, "Mixing Chamber Design Considerations for ChromaLit™ Remote Phosphor Light Sources", Aug. 29, 2012, downloaded from the internet at: http://www.intematix.com/uploads/files/intematix_mixing_chamber_design_for_chormalit.pdf on Oct. 30, 2012, 12 pages.

International Bureau of WIPO, International Preliminary Report on Patentability, PCT/US2008/070621, dated Jan. 19, 2010, 6 pages.

International Searching Authority, The International Search Report and Written Opinion of the International Searching Authority, PCT/US2008/070621, dated Sep. 26, 2008, 9 pages.

International Searching Authority, The International Search Report and Written Opinion of the International Searching Authority, PCT/US2012/66463, dated Apr. 2, 2013, 18 pages.

Liu, et al. "Effects of Phosphor's Location on LED Packaging Performance", 2008 International Conference on Electronic Packaging Technology & High Density Packaging (ICEPT-HDP 2008), 7 pages.

Liu, et al. "Effects of Phosphor's Thickness and Concentration on Performance of White LEDs", 2008 International Conference on Electronic Packaging Technology & High Density Packaging (ICEPT-HDP 2008), 6 pages.

Mims III, Forrest, "Sun Photometer with Light-Emitting Diodes as Spectrally Selective Detectors", Applied Optics 31, 6965-6967, 1992.

Carr et al., "One-Watt GaAs p-n Junction Infrared Source", Applied Physics Letters, vol. 3, No. 10, Nov. 15, 1963, pp. 173-175.

W. N. Carr, "Photometric Figures of Merit for Semiconductor Luminescent Sources Operating in Spontaneous Mode", Infrared Physics, 1966, vol. 6, pp. 1-19.

Authorized Officer Blaine R. Copenheaver, Notification of Transmittal of the International Search Report and Written Opinion, International Application No. PCT/US2013/059511, dated Feb. 14, 2014, 7 pages.

Authorized Officer Blaine R. Copenheaver, Notification of Transmittal of the International Search Report and Written Opinion, International Application No. PCT/US2013/059545, dated Feb. 14, 2014, 15 pages.

Authorized Officer Blaine R. Copenheaver, Notification of Transmittal of the International Search Report and Written Opinion, International Application No. PCT/US2013/059544, dated Feb. 14, 2014, 9 pages.

Authorized Officer Blaine R. Copenheaver, Notification of Transmittal of the International Search Report and Written Opinion, International Application No. PCT/US2013/059525, dated Feb. 19, 2014, 9 pages.

Authorized Officer Blaine R. Copenheaver, Notification of Transmittal of the International Search Report and Written Opinion, International Application No. PCT/US2014/021778, dated Jun. 23, 2014, 11 pages.

Japanese Application No. 2014-543597, Decision of Rejection, dated Apr. 24, 2017, 130 pages.

\* cited by examiner

NEARLY INDEX-MATCHED LUMINESCENT GLASS-PHOSPHOR COMPOSITES FOR PHOTONIC APPLICATIONS

CROSS-REFERENCE TO RELATED APPLICATIONS

This application is a continuation application of U.S. patent application Ser. No. 15/236,127, filed Aug. 12, 2016, which is a continuation application of U.S. patent application Ser. No. 14/792,501, filed Jul. 6, 2015, which is a continuation application of U.S. patent application Ser. No. 14/444,829, filed Jul. 28, 2014, which is a continuation of U.S. patent application Ser. No. 13/794,060, filed Mar. 11, 2013, which is a continuation application of U.S. patent application Ser. No. 12/669,579, filed Jun. 28, 2010, which is a 371 of International Application PCT/US2008/070621, filed Jul. 21, 2008, which in turn, is a non-provisional application of U.S. Provisional Application No. 60/961,185, filed Jul. 19, 2007, the disclosures of which are incorporated herein by reference.

TECHNICAL FIELD

The present invention relates generally to the field of solid-state lighting and more specifically to high efficiency phosphor-converted LEDs.

BACKGROUND

Solid-state lighting (SSL) is a type of lighting that does not use an electrical filament or a gas in the production of light. A primary advantage of SSL over conventional lighting technologies is the potential energy savings as a result of its higher luminous efficiencies over conventional lighting devices. For example, SSL is capable of 50% efficiency with 200 lumen per watt (lm/W) efficacy (compared to 15 lm/W for incandescents and 60-90 lm/W for fluorescents) and up to 100 khr lifetimes. This is approximately 100 times the lifetime of conventional incandescent bulbs and 10 times the lifetime of fluorescents. The Department of Energy (DOE) has set a goal of 50% electrical-to-optical system efficiency with a spectrum accurately reproducing the solar spectrum by 2020. The Optoelectronic Industry Development Association (OIDA) aims for 200-hm/W luminous efficiency with a color rendering index greater than 80.

Each of these conventional methods and devices has deficiencies. Color mixing is hindered by the absence of an efficient LED material in the 500 nm to 580 nm (green to-yellow) range. Wavelength conversion suffers from phosphor conversion loss and package designs that do not extract phosphor-converted light efficiently.

SSL devices primarily include light emitting diodes (LEDs), which include a small chip semiconductor, i.e. the LED source, mounted in a reflector cup on a lead frame. The LED source generates photons of light at a first wavelength when energized. The reflector cup reflects photons out of the LED. An optic, generally a silicone or epoxy encapsulation, aids in light extraction from the LED source and protects the LED components.

High efficiency generation of white light with LEDs has conventionally been according to one of three methods: 1) color mixing; 2) wavelength conversion; or 3) a combination of methods 1 and 2. Color mixing is the use of multiple LEDs across the visible spectrum (e.g. blue+green+red LEDs), which combine to produce a white light. Wavelength conversion is the use of a single, efficient, short wavelength LED emitting light at the first wavelength, which is then at least partially absorbed by a phosphor within the LED and re-emitted at a second wavelength. LEDs under method 2 are generally referred to as phosphor-converted LEDs (pcLEDs).

Conventional pcLEDs have generally two structural arrangements. First, the phosphor can encompass the LED source of the LED. The phosphor is typically a YAG:Ce crystalline powder in direct contact with the blue wavelength emitting LED source. Both are positioned upon a heat sink base and surrounded by an optic. The other arrangement is a scattered photon extraction (SPE) pcLED, which positions a planar phosphor-layer at a distance away from the LED source. Herein, the YAG:Ce phosphor, in powder form, creates a diffuse, semitransparent layer upon an acrylic optic with a planar surface.

When the phosphor is in direct contact with the LED source, the phosphor suffers from optical losses by reflection of phosphor-emission back into the LED source rather than through the optic and out of the LED. This can account for up to 60% of the total phosphor emission. The SPE pcLED suffers from scattering of the phosphor emissions. Scattering is the result of substantial differences in the indices of refraction of the phosphor powder and the material that encapsulates the phosphor (air, silicon, PMMA, or glass). The index of refraction, n, is a measure of the relative speed of light in a medium as compared to in a vacuum (where n.sub.vac=1). When light passes from one medium to another medium with a substantially different index of refraction, the speed and direction of the light changes and is known as refraction. Refraction can lead to a randomization, or scattering, of the directionality of the light. Scattering then reduces efficiency by increasing the path length (a) inside the phosphor layer by trapping of the emissions by total internal reflection and (b) inside the device package because of random directionality of the phosphor emission, both of which can lead to reabsorption and optical loss.

These phosphor-related deficiencies are then compounded by secondary losses encountered by other package design deficiencies, such as imperfections of the reflector cup within the LED. While the reflector cup is intended to direct the phosphor-emission out of the LED, internal reflections and path randomization can trap a portion of the phosphor-emission, such as between the reflector cup and the phosphor, and decrease LED efficiency by approximately 30%.

Thus, to reach the efficiency goals set forth by the DOE, the problems associated with package design must be eliminated by designing a high efficiency LED that resolves the issues identified above.

SUMMARY OF THE INVENTION

According to the embodiments of the present invention, a light emitting composite material is described. The light emitting composite material includes a glassy material and a plurality of phosphor particles suspended within the glassy material, wherein the refractive index of the plurality of phosphor particles is approximately equal to the refractive index of the glassy material.

The plurality of phosphor particles can be composed of an inorganic crystalline material selected from the group consisting of $Y_xGd_yAl_vGa_wO_{12}O:M^{3+}$, wherein x+y=3 and v+w=5; $SrGaS_4:M^{2+}$; $SrS:M^{2+}$; $X_2Si_5N_8:M^{2+}$; and $XSi_2O_2N_2:M^{2+}$, wherein X is selected from the group consisting of He, Mg, Ca, Sr, and Ba and wherein M is selected from a group consisting of Ce, Eu, Mn, Nd, Pr, Sm, Gd, Tb, Dy, Ho, Br, Tm, Yb, Lu, Sc, Ti, V, Cr, Pe, Co, Ni, Cu, Zn, Ir, and Pt.

The glassy material can be an optical glass comprising an amount from 5% to about 35% of $SiO_2$; an amount from about 55% to about 88% of PbO; optionally an amount less than 10% $B_2O_3$; optionally a combined amount less than 8% of $Na_2O$ and $K_2O$; and optionally a combined amount less than about 15% total of $TiO_2$, $ZrO_2$, $La_2O_3$, ZnO, and BaO.

In other light emitting composites, the glassy material can be an optical glass comprising an amount from about 21% to about 30% of $TIO_2$; an amount from about 30% to about 50% of BaO, NaO, BeO, CaO, SrO, CdO, $Ga_2O_3$, $In_2O_3$, or $Y_2O_3$; an amount from about 18% to about 24% of $Al_2O_3$; and an amount from about 1% to about 10% of $SiO_2$, $B_2O_3$, PbO, $GeO_2$, $SnO_2$, $ZrO_2$, $HfO_2$, or $ThO_2$.

In another aspect of the present invention, the light emitting composites of the present invention can be used within a phosphor-containing light emitting device (pcLED). The pcLED can be constructed as an Enhanced Light Extraction by Internal Reflection (ELIXIR) LED device.

In yet another aspect of the present invention, the light emitting composite can be used with a solid-state laser.

In yet another aspect of the present invention, the light emitting composite can be used as a luminescence collector.

DETAILED DESCRIPTION

Efficiency of a fully wavelength converted pcLED can be expressed as $$\eta_{pcL} = \eta_{LED} \cdot \eta_s \cdot \eta_q \cdot \eta_p \qquad \text{Equation 1}$$

where $\eta_{pcL}$ is the total pcLED efficiency and is dependent upon the efficiency of the particular LED source, $\eta_{LED}$; the Stokes conversion efficiency, $\eta_s$, which is the quantum ratio of the average emission wavelengths of the LED and the phosphor; the phosphor quantum efficiency, $\eta_q$, which indicates the efficiency of the quantum conversion of light from a first wavelength to a second wavelength inside the phosphor; and the package efficiency, $\eta_p$, which is the efficiency of light extraction of LED- and phosphor-emitted photons from the LED device package. The product of $\eta_q \cdot \eta_p$ is the conversion efficiency (CE) for an LED device. The embodiments of the present invention optimize CE.

Package efficiency, $\eta_p$, of the present invention is improved over conventional LED devices by first separating an LED source 12 from first and second non-planar layers, wherein the second layer is composed of a phosphor 14, which will nearly eliminate the reflection of phosphor- and LED-emissions back into the LED source 12. Secondly, a planar reflector 16 is used to reduce the number of mirror reflections over the conventional LED. The result is an Enhanced Light eXtraction by Internal Reflection (ELIXIR) LED device 10, shown in FIG. 1.

Figure 1:
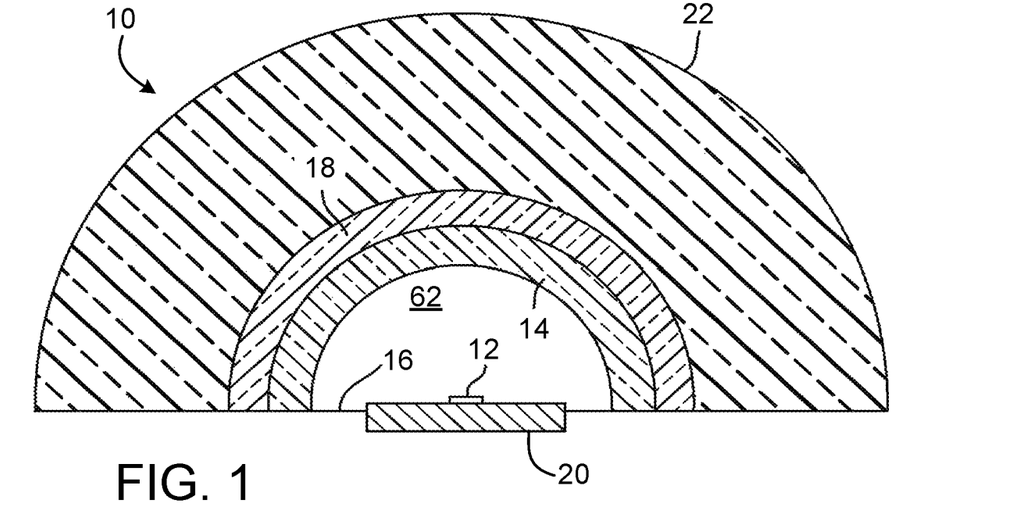
FIG. 1 is a diagrammatic cross-sectional view of the ELIXIR LED device according an embodiment of the present invention.

The ELIXIR LED 10 more specifically includes the first non-planar layer, i.e. a glass cover 18, surrounding and making immediate contact with the second non-planar layer, i.e. a phosphor 14, and a LED source 12 upon a heat sink base 20. The phosphor 14 and the LED source 12 are separated by a radius sufficient to substantially reduce the likelihood of phosphor-emissions reentering the LED source 12. This distance, r, is dependent upon a specified fraction of reentry, P, and is given by:

$$r \leq \sqrt{[A/(4 \cdot \pi \cdot P)]} \qquad \text{Equation 2}$$

Herein, A is the size of the LED source 12, i.e. the surface area of the LED chip. The high package efficiency is maintained as long as the proportions of the ELIXIR LED 10, namely the $r_{phosphor}/r_{optic}$ ratio, are preserved, as described below in connection with FIG. 5B. The ELIXIR LED 10 size is ultimately limited by the size of the LED source 12. The distance to the phosphor 14 from the LED source 12 must be sufficiently long so that only a small fraction of converted light re-enters the LED source 12, where high losses occur. For example, a typical power LED chip has an area of ~1 $mm^2$. If we specify that less than 1% of phosphor light emitted from any point on the phosphor 14 may reenter the LED source 12, a minimum LED source 12 to phosphor 14 separation of approximately $\sqrt{1\ mm^2/(4\pi(0.01))}$, or ~2.8 mm is obtained. The minimum ELIXIR LED 10 diameter would be four times this value, ~1.1 cm, which is approaching the size of the transparent lens encapsulation and smaller than the heat sink diameter on a typical power LED.

The LED source 12 can include any conventional resonance cavity LED or laser diode source generally emitting a light having a first wavelength ranging between about 350 nm to about 500 nm. This can include, but should not be limited to, a blue power LED with a peak wavelength of 455 nm with a 1000 mA DC drive capability.

The glass cover 18 can be any material suitable for the lens construction and for protection of the phosphor 14 and LED source 12, such as polymethyl methacrylate (PMMA) silicones, and glasses. In an alternative embodiment described herein, the glass cover 18 and the phosphor 14 may be made integral.

Figure 2:
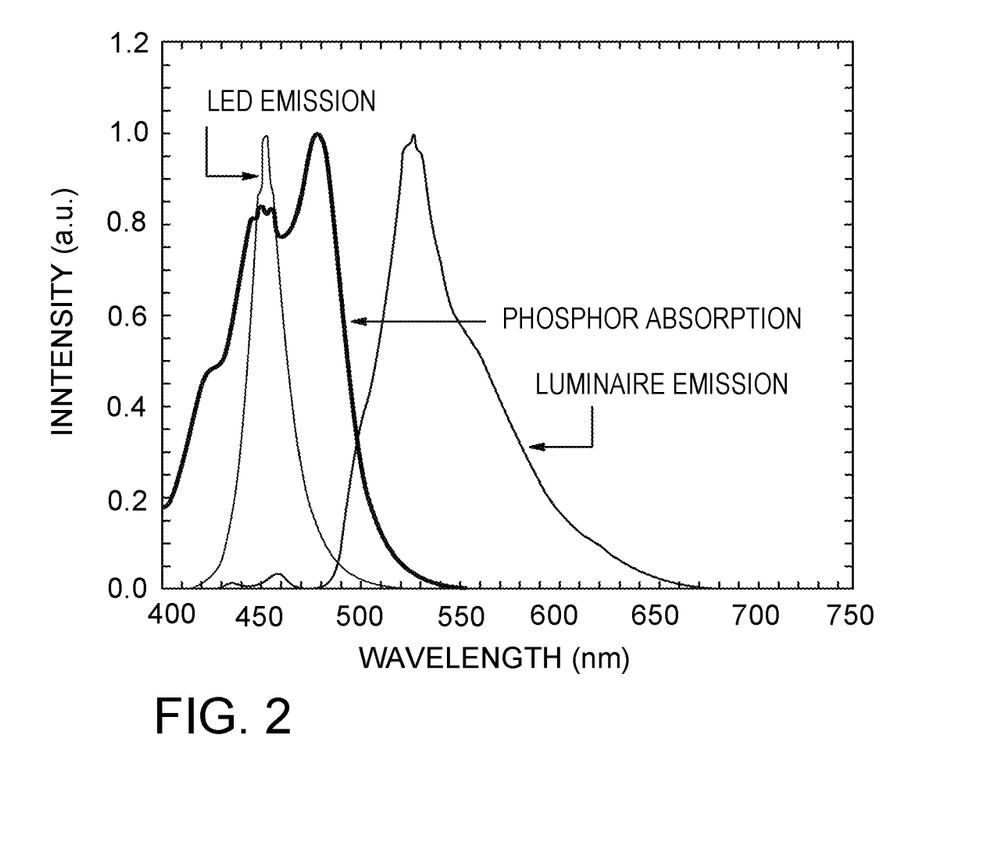
FIG. 2 is a sample spectrum demonstrating the LED source emission band, the phosphor absorption band, and the phosphor emission band.

The phosphor 14 is applied to the glass cover 18 as a layer of inorganic phosphor crystalline powder. The phosphor 14 can be applied as a layer, for example, of about 100 μm in thickness, to an inner surface of the glass cover 18 from a solution of acetone or other solvent. The phosphor 14 should be selected such that the phosphor absorption band substantially overlaps with the LED-emission band, as shown in FIG. 2. This ensures efficient transfer from the first wavelength, the LED-emission, to the second wavelength, the phosphor-emission. Thus, a suitable phosphor for use with the blue power LED source can be Johnson Polymer Joncryl 587 modified styrene acrylic with 0.2% BASF Lumogen F Yellow 083 fluorescent dye.

Though not specifically shown, the glass cover 18 can be eliminated and the phosphor 14 is applied as a layer upon the inside radius of a hemispherical optic 22.

Figure 3:
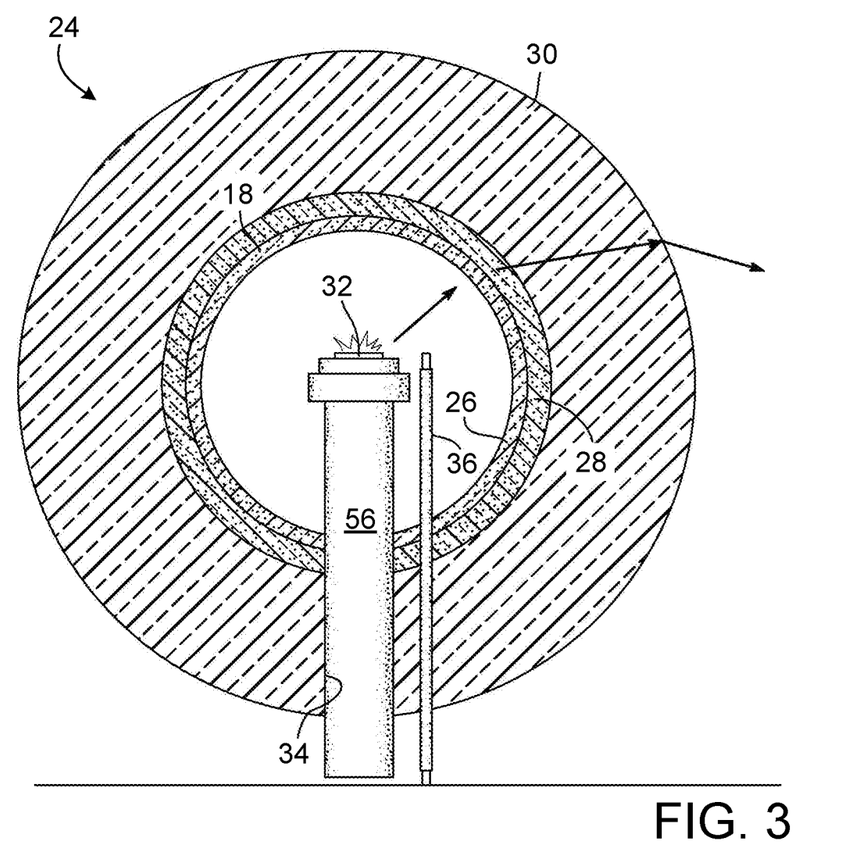
FIG. 3 is a diagrammatic cross-sectional view of the ELIXIR LED device according to another embodiment of the present invention.

While the phosphor 14, glass cover 18, and optic 22 are generally illustrated and explained with a hemispherical shape, the shape should not be considered so limited. That is, the shape can include hemispheres (see FIG. 1), ellipsoids, spheres 24 (see FIG. 3), or other similar shapes as is desired or necessary. In this way, the phosphor 26, glass cover 28, and optic 30 will include an opening 34 for electrical connections 36 and support 38 to the LED source 32. While not necessary, the opening 34 should be small in construction to further minimize emission losses.

Figure 4:
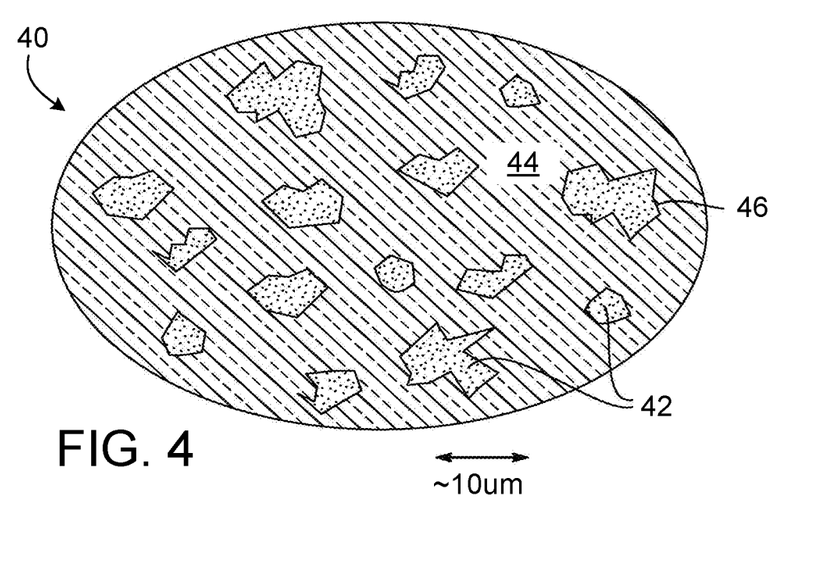
FIG. 4 is an enlarged diagrammatic cross-sectional view of a nearly-indexed matched luminescent glass crystal composite.

In optimizing TN of Equation 1 and the ELIXIR LED 10 of FIG. 1, the phosphor 14 and glass cover 18 are replaced with a light emitting composite material 40 of FIG. 4. The light emitting composite material 40 integrates the first and second non-planar layers as an inorganic crystalline 42 suspended in a glassy material 44 matrix as illustrated in FIG. 4. The inorganic crystalline 42 and glassy material 44 are selected such that, $n_c$, the index of refraction of the inorganic crystalline 42 is approximately equal, $n_g$, to the index of refraction of the glassy material 44. The result is a nearly index-matched luminescent glass-crystal composite (NIMLGCC) 40 that maximizes the quantum efficiency of the phosphor by reducing, or eliminating, optical scattering.

Because of their large surface-to-volume ratio, nanoparticles have low quantum efficiencies. Thus, the inorganic crystalline 42 should be a particle 46 that is larger than about 10 nm, i.e. not a nanoparticle. However, because the light-emitting composite material 40 has a finite thickness, the inorganic crystalline 42 should be smaller than the thickness of the light-emitting composite material 40. Suitable inorganic crystalline 42 can include $Y_xGd_yAl_vGa_wO_{12}:M^{3+}$, wherein x+y=3 and v+w=5; $SrGa_2S_4:M^{2+}$; $SrS:M^+$; $X_2Si_5N_8:M^{2+}$; and $XSi_2O_2N:M^{2+}$, wherein X is selected from a group consisting of Be, Mg, Ca, Sr, and Ba and wherein M is selected from a group consisting of Ce, Eu, Mn, Nd, Pr, Sm, Gd, Ib, Dy, Ho, Er, Tm, Yb, Lu, Sc, Ti, V, Cr, Fe, Co, Ni, Cu, Zn, Ir, and Pt.

It would be permissible for the light-emitting composite material 40 to comprise a combination of different inorganic crystallines 42 to obtain a color mixing result of broadband white light emission. For example, two or more UV- or violet-short wavelength inorganic crystalline materials 42 in the 350 nm to 430 nm range will absorb the first wavelength from the LED source 12 and reemit a combination of red, green, and blue light to achieve a broadband white. The broadband white resulting from a color-mixing light-emitting composite 40 is more highly uniform as compared to conventional phosphor color mixing because the emissions of red, green, and blue originate from the same location. In another example, where blue or blue-green short wavelength LED sources 12 are used (430 nm to 500 nm), these inorganic crystalline materials 42 will reemit the first wavelength in combination with red and green light to achieve a broadband white.

The glassy material 44 in which the inorganic crystalline material is suspended can include an optical glass or other glass material, such as those manufactured by Schott North America (Elmsford, N.Y.) including SF-57, SF-67, LASF-9. LASRP47, SK-57. PK-51, PK-53, FK-51A, and FK-5. Other optical glasses can include those according to the teachings of U.S. Appl. No. 2005/0075234 or U.S. Pat. No. 3,960,579, which are hereby incorporated by reference, in their entirety.

The glassy material 44 can comprise about 10% to about 99.9% of the light emitting composite material 40 by weight.

As indicated above, the selection of an inorganic crystalline 42 and glassy material 44 should be according to index-matching. That is, the index of refraction, $n_c$, of the inorganic crystalline 42 should be approximately equal to the index of refraction, $n_g$, of the glassy material to provide an index of refraction, nz, for the light-emitting composite material 40.

By nearly index-matching the inorganic crystalline 42 to the glassy material 44, scattering induced loss is nearly eliminated. That is, by establishing no $n_g$ that is approximately equal to $n_c$, the phosphor-emission will travel at a speed within the inorganic crystalline 42 that is approximately equal to the travel speed within the glassy material 44 and thus reduce refraction, or a change in the direction of the emission. As a result scattering is reduced and $\eta_p$ increased.

Figure 5A:
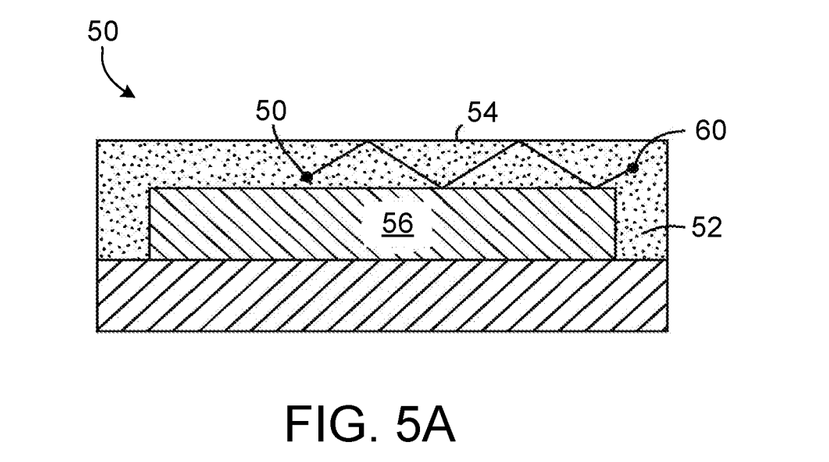
FIG. 5A is a diagrammatic cross-sectional view of the total internal reflections within a conventional pcLED device.

Total internal reflections occur when the interface between first and second material 52, 54 cannot be traversed by light, as illustrated with a conventional LED device 50 in FIG. 5A. This condition at the interface occurs when the refractive index of the first material 52 (here the phosphor) is greater than the refractive index of the second material 54. According to Snell's Law, the light cannot traverse the interface, but will either refract along the interface or undergo total internal reflection. Total internal reflection of the emission 58 continues until all of the energy in the emission is reabsorbed 60 by the phosphor.

Figure 5B:
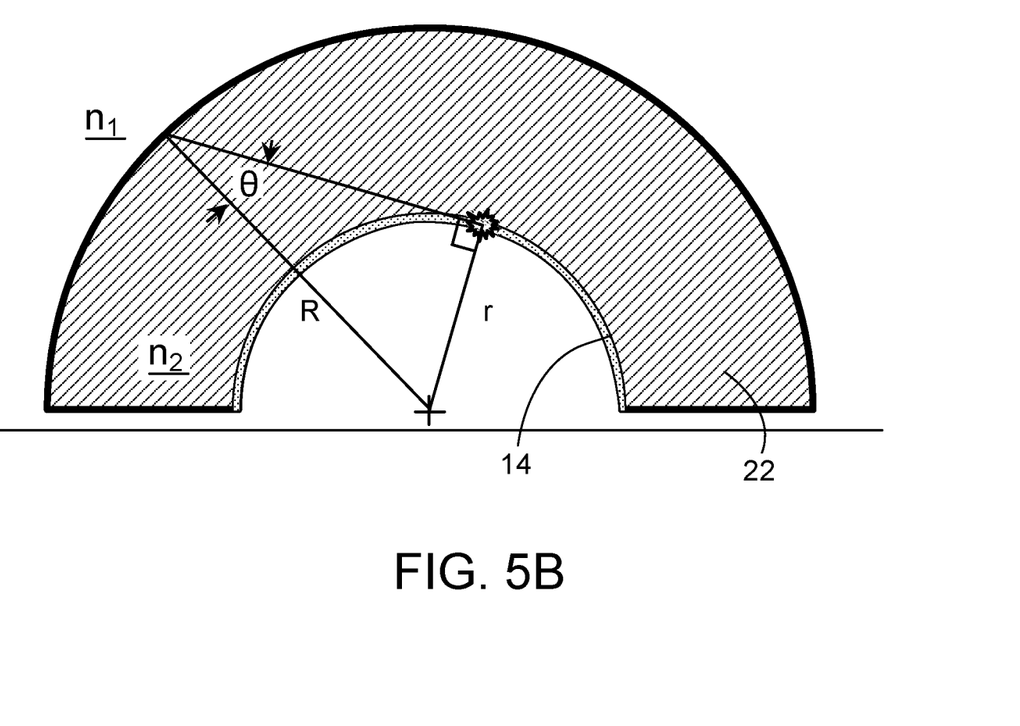
FIG. 5B is a diagrammatic cross-sectional view that illustrates the relation between the relative radii of first and second materials, which leads to total internal reflection.

FIG. 5B shows a hemispherical optic 22 having an internal radius, r, and an outer radius, R. Here, phosphor 14 (which includes, e.g. the light-emitting composite material 40) is located at the internal radius r of the optic 22. Ideally, the optic 22 is constructed from the same transparent material as a host material of the phosphor 14 (e.g. the host material 44 of the light-emitting composite material 40.) In this manner, a refractive index $n_2$ of the optic 22 is equal to or larger than the refractive index of the phosphor 14. A refractive index of the medium that surrounds the optic 22 is $n_1$. Snell's Law can be used to calculate a configuration of the optic 22 for which total internal reflections are eliminated inside the optic 22. This configuration is determinable by establishing a ratio of a radius to the phosphor 14 (which includes, e.g. the light-emitting composite material 40), r, to a radius to the outer diameter of the optic 22, R. This ratio of radii must be less than or equal to the ratio of the index of refraction for material external to the optic 22 (and, hence, external to the ELIXIR LED device 10), $n_1$, and $n_2$:

$$r/R \leq n_1/n_2 \qquad \text{Equation 3}$$

Often, this material external to the ELIXIR LED 10 will be air, or vacuum, having $n_1=1$. Thus, total internal reflection inside the optic 22 will be avoided when r/R is less than the inverse of $n_2$.

Figure 9:
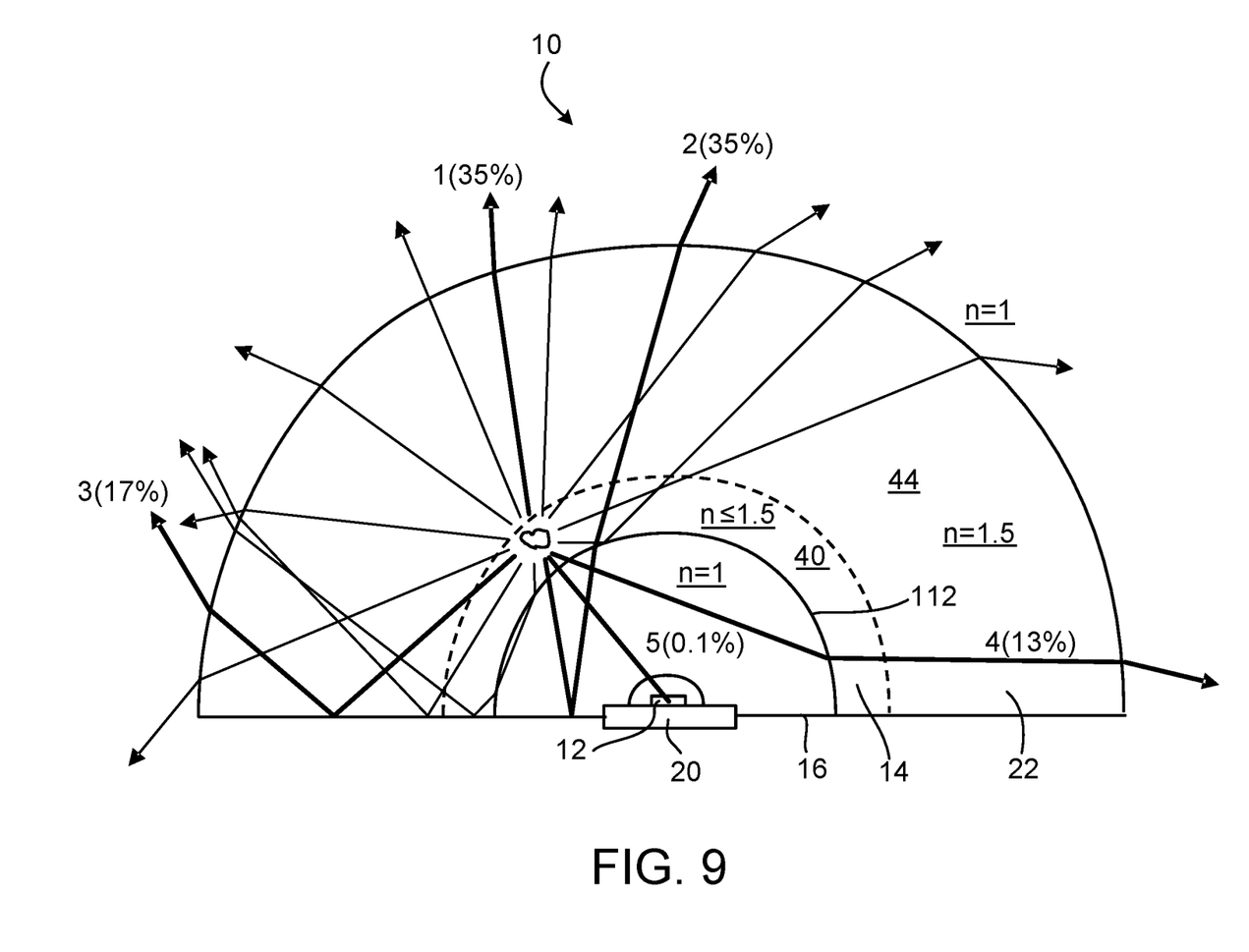
FIG. 9 is a diagrammatic cross-sectional view of the result of a ray trace diagram for the ELIXIR LED device according to one embodiment of the present invention.

The ELIXIR LED 10 of FIG. 9 includes a planar reflector 16, an LED source 12 protruding through the planar reflector 16, a phosphor 14—in this case including the light-emitting composite material 40—and an optic 22. The phosphor 14 is spaced apart from the LED source 12, such that an enclosure formed by the phosphor 14 and the planar reflector 16 encloses the LED source 12. In this case, a medium inside the enclosure is air, with refractive index n=1. The phosphor 14 and the optic 22 are coupled together and positioned upon the planar reflector 16 as provided by Equation 3. Materials for the planar reflector 16 can include aluminized Mylar attached to an acrylic sheet or a 3M Vikuiti enhanced specular reflector film. By eliminating the reflector cup of conventional, LED package design, phosphor-emission can leave the ELIXIR LED 10 without being trapped between the planar reflector 16 and the phosphor 14.

Finally, the optic 22 positioned externally to the light-emitting composite material 40 can be constructed of a glass material similar to the glassy material 44 of the light-emitting composite material 40. Other materials can also be used so long as refractive index of the optic 22 is greater than or equal to $n_2$. Suitable materials for the optic 22 construction can be polymethyl methacrylate (PMMA), silicones, and glasses having refractive indices of about 1.3 to about 2.2.

When PMMA is used in constructing the optic 22, the method can include polymerization of a methyl methacrylate monomer around a 25 mL round bottom flask to form an inner radius of the optic 22 with an inner diameter of approximately 3.8 cm. The outer diameter of the optic 22 can be shaped, for example, by an aluminum mold. However, other fabrication methods would be known and the size could be varied according to a particular need.

The monomer for constructing the optic 22 can be purified to eliminate contaminants. For PMMA, the methyl methacrylate monomer can be washed with a solution of sodium hydroxide, rinsed with deionized water, and dried with anhydrous magnesium sulfate. Polymerization can be initiated by benzoyl peroxide and heating the solution to 90° C. The resultant viscous solution is then poured into a mold, such as the one described previously, and then cured in an oven at 35° C. for one week.

The optic 22 could also be produced with a high quality injection molding of PMMA rather than polymerization.

While the ELIXIR LED 10 of FIG. 9 is generally shown to include an air gap 62, it would be understood that the air gap 52 can be partially, or completely, replaced with a glass or polymer having an refractive index less than or equal to $n_2$.

Figure 6:
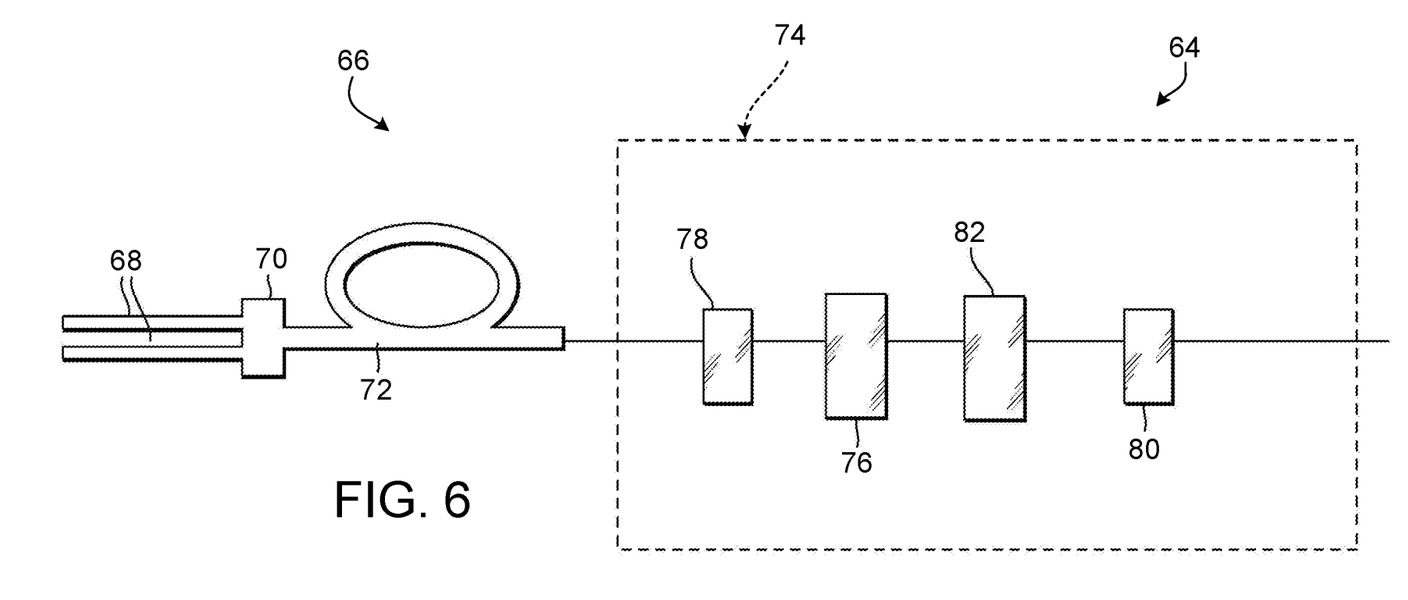
FIG. 6 is a diagrammatic view of a conventional pumped solid-state laser device.
Figure 7:
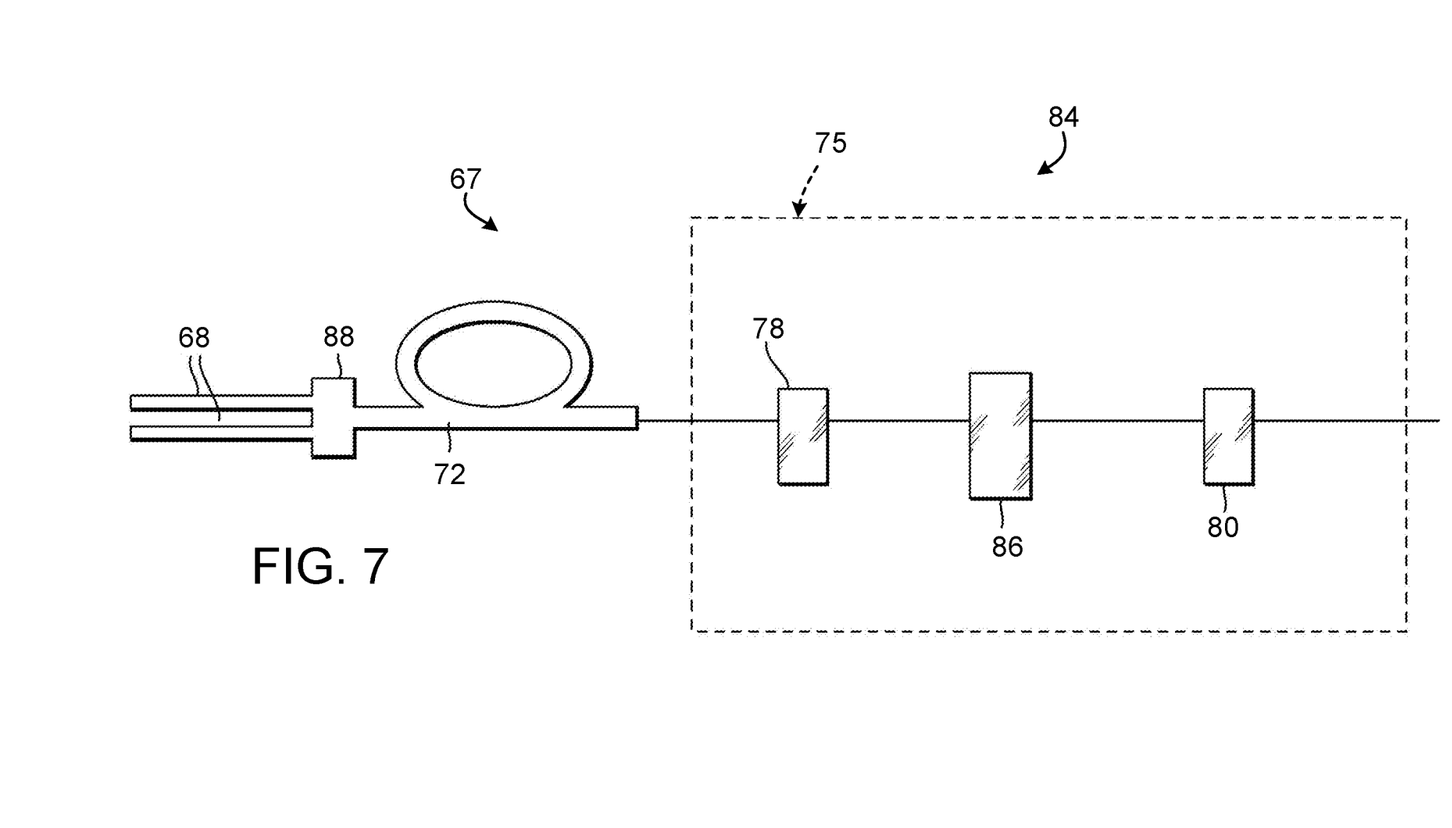
FIG. 7 is a diagrammatic view of a pumped solid-state laser device according to an embodiment of the present invention.

In other embodiments, the NIMLGCC can be used with visible diode-pumped solid-state lasers 84 as illustrated in FIG. 7. Conventional diode-pumped solid-state lasers 64 (see FIG. 6) include a light source 66 comprising a power source 68 providing energy to a diode pump 70, such as AlGaAs laser diode. Photons emitted from the diode pomp 70 are directed into a laser cavity 74 by a fiber 72. The photons entering the laser cavity 74 are directed to a population inversion crystal 76, such as a YAG:Nd, which when excited by the photons will emit a light at a first wavelength (at 1064 nm). Light of this first wavelength can then reflect between input and output mirrors 75, 80 and yield a coherent emission, characteristic of the solid-state loser 64. A portion of the first wavelength will impact a doubling crystal 82, such as a potassium titanium oxide phosphate (KTP) crystal, which doubles the frequency of the light (conversion of the first wavelength to a second wavelength equal to 532 nm). Light of the second wavelength is not reflected by the output mirror 80, but rather passes through the output mirror 80 as the laser output.

However, the YAG:Nd population inversion crystal 76 and KTP doubling crystal 82 are a highly expensive component of the conventional pumped solid-state laser 64. The NIMLGCC, as explained above, can provide an economical and energetically efficient alternative to the conventional pumped solid-state laser 64.

For example, as in FIG. 7, the YAG:Nd population inversion crystal 76 and NTP doubling crystal 82 are replaced by an NIMLGCC crystal 86 in the pumped solid-state laser 84 according to the present invention. The NIMLGCC crystal 86 can be constructed in a manner as described above and is generally molded and polished to a typical optics standard. In this way, a first wavelength, such as from a 405 nm emitting Indium Gallium Nitride (InGaN) diode 88 of the light source 67, reflects between the input and output mirrors 78, 80 as a coherent emission within laser cavity 75. At least a portion of this first wavelength can be absorbed by the NIMLGCC crystal 86 and a second wavelength is emitted. This second wavelength will traverse the output mirror 80 and will be emitted as the laser output.

Figure 8:
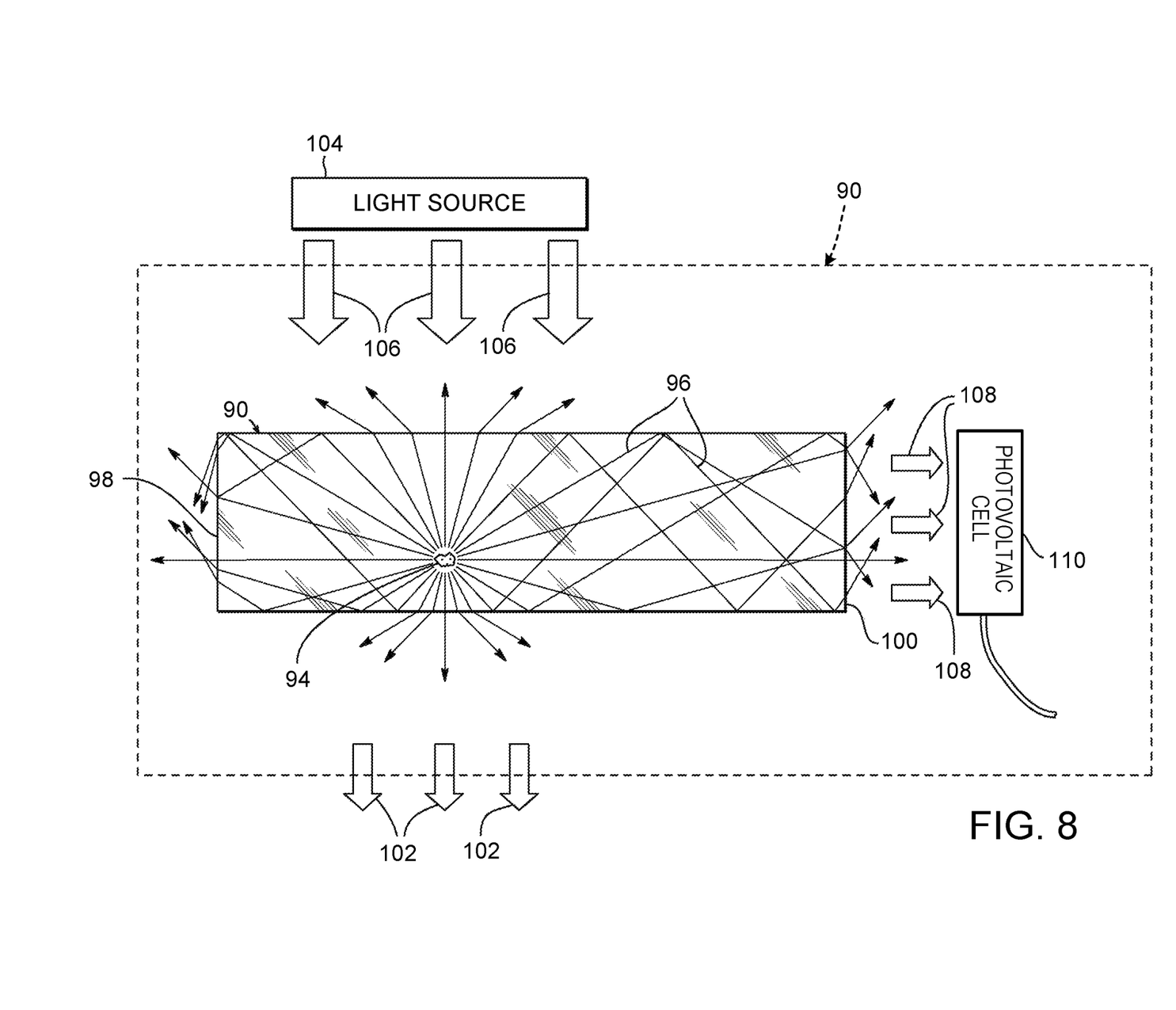
FIG. 8 is a diagrammatic view of a luminescence collector according to an embodiment of the present invention.

In yet another embodiment, the NIMLGCC can be used as a luminescence collector 90 for energy conversion, as shown in FIG. 8. Therein, the NIMLGCC is molded into a sheet acting as a light tube 92. As a light tube 92, the phosphor emissions 94 will be contained as total internal reflections 96, which are directed toward first and second ends 98, 100 of the light tube 92. Total internal reflection 96 is accomplished by the selection of an NIMLGCC material for the light tube 92 in accordance with Snell's law and as described previously. Thus, the NIMLGCC material should be selected so as to maximize the total internal reflections 96 from the phosphor emissions 94 while minimizing transmitted light 102.

In operation of the light tube 92, a light source 104 emits a first wavelength incident 106 to the light tube 92. The first wavelength is absorbed by an inorganic crystalline 42 within the NIMLGCC light tube 92 and reemitted at a second wavelength. This second wavelength is transmitted through the light tube 92 by total internal reflection 96 to the first or second ends 98, 100 of the light tube 92. As the second wavelength leaves the light tube 92 at the first or second ends 98, 100 as reflected light 108, the reflected light 108 impacts a photovoltaic cell 110. The photovoltaic cell 110 collects a substantial portion of the reflected light 108 and converts the reflected light 108 into another energy, such as electrical current.

The light tube 92 can be constructed with a small edge profile, which enables the use of a relatively small photovoltaic cell 110. Thus, the first and second ends 98, 100 of the light tube 92 are approximately similar in size to the surface area of the photovoltaic cell 110. This allows for increased likelihood that the reflected light 108 will impact the photovoltaic cell 110.

Suitable materials for the photovoltaic cell are known, but can generally include Si, Ge, GaAs, AlAs, InAs, AlP, InP, GaP, ZnSe, or CdSe, or combinations thereof.

Example 1

The efficiency of the ELIXIR LED 10 according to the present invention is demonstrated with a computer simulation of a ray tracing diagram, shown in FIG. 9. Herein, the ELIXIR LED 10 is constructed as described above with a phosphor radius, r, and equal to 1.9 cm.

The ray tracing diagram illustrates the various paths the phosphor-emitting photons can take in exiting the ELIXIR LED 10. Ray 1 exits the ELIXIR LED 10 without encountering any reflections and comprises approximately 35% of the phosphor-emissions. Ray 2 (representing approximately 35% of the phosphor-emission) demonstrates one particular benefit of the ELIXIR LED 10. Ray 2 is emitted in a direction toward the planar reflector 16, where substantial emissions loss occurs in a conventional pcLED package design. However, in the ELIXIR LED 10, the phosphor emission is reflected at the phosphor-air interface 112. Ray 2 can then exit the ELIXIR LED 10 and may avoid the planar reflector 16 entirely. Ray 3, comprising approximately 17% of the phosphor-emission, heads directly to the reflector 16 before exiting the ELIXIR LED 10 and never encounters the phosphor-air interface 112. Ray 4 is transmitted across the phosphor-air interface 112 but avoids the LED source 12 and recrosses the phosphor-air interface 112 before exiting the ELIXIR LED 10. The transmissions represented by Ray 4 account for approximately 13% of the total phosphor emissions. Finally, Ray 5 is transmitted across the phosphor-air interface 112 and enters the LED source 12 where the highest losses would occur within conventional LED package designs. In the ELIXIR LED 10 constructed with a radius of the phosphor 14, Ray 5 comprises less than 0.1% of the total phosphor-emission.

While the invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. Thus, the invention in its broader aspects is therefore not limited to the specific details, representative apparatus and method, and illustrative example shown and described. Accordingly, departures may be made from such details without departing from the spirit or scope of applicants' general inventive concept.

What is claimed is:

1. A system comprising:
   a light source operable to emit light having a first wavelength;
   a light tube
      (i) composed of a light emitting composite material, the light emitting composite material
         (a) containing a plurality of phosphor particles and a glassy material, wherein a refractive index of each of the phosphor particles is approximately equal to a refractive index of the transparent glassy material, and
         (b) configured to absorb the light having the first wavelength and emit phosphor-emitted light having a second wavelength, and
      (ii) configured to direct the phosphor-emitted light to an opening of the light tube; and
   a photovoltaic cell at the opening of the light tube, the photovoltaic cell operable to convert the phosphor-emitted light to an electrical current.

2. The system of claim 1, wherein the plurality of phosphor particles contained in the light emitting composite material are composed of an inorganic crystalline material selected from the group consisting of:
   $Y_xGd_yAl_vGa_wO_{12}:M^{3+}$, wherein x+y=3 and v+w=5;
   $SrGa_2S_4:M^{2+}$;
   $SrS:M^{2+}$;
   $X_2Si_5N_8M^{2+}$; and
   $XSi_2O_2N_2:M^{2+}$, wherein X is selected from the group consisting of Be, Mg, Ca, Sr, and Ba and wherein M is selected from a group consisting of Ce, Eu, Mn, Nd, Pr, Sm, Gd, Tb, Dy, Ho, Er, Tm, Yb, Lu, Sc, Ti, V, Cr, Fe, Co, Ni, Cu, Zn, Ir, and Pt.

3. The system of claim 1, wherein the glassy material contained in the light emitting composite material is an optical glass comprising:
   an amount from about 5% to about 35% of $SiO_2$;
   an amount from about 55% to about 88% of PbO;
   optionally an amount less than about 10% of $B_2O_3$;
   optionally a combined amount less than about 8% of $Na_2O$ and $K_2O$; and
   optionally a combined amount less than about 15% total of $TiO_2$, $ZrO_2$, $La_2O_3$, ZnO, and BaO.

4. The system of claim 1, wherein the glassy material contained in the light emitting composite material is an optical glass comprising:
   an amount from about 21% to about 30% of $TiO_2$;
   an amount from about 30% to about 50% of BaO, NaO, BeO, CaO, SrO, CdO, $Ga_2O_3$, $In_2O_3$, or $Y_2O_3$;
   an amount from about 18% to about 24% of $Al_2O_3$; and
   an amount from about 1% to about 10% of $SiO_2$, $B_2O_3$, PbO, $GeO_2$, $SnO_2$, $ZrO_2$, $HfO_2$, or $ThO_2$.

5. The system of claim 1, wherein the glassy material contained in the light emitting composite material is a Schott glass.

6. The system of claim 1, wherein the refractive index of the plurality of phosphor particles contained in the light emitting composite material is within five percent of the refractive index of the transparent glassy material contained in the light emitting composite material.

7. The system of claim 1, wherein the plurality of phosphor particles contained in the light emitting composite material are composed of $Y_3Al_5O_{12}:Ce^{3+}$ and the glassy material is a Schott glass.

8. The system of claim 1, wherein the plurality of phosphor particles contained in the light emitting composite material have a size ranging from about 100 nm to about 100 µm.

9. The system of claim 1, wherein the plurality of phosphor particles contained in the light emitting composite material are composed of an inorganic crystalline material having a refractive index of about 1.5 to about 2.8 and the glassy material contained in the light emitting composite material has a refractive index of about 1.5 to about 2.8.

10. The system of claim 1, wherein the first wavelength ranges from about 350 nm to about 500 nm.

11. The system of claim 1, wherein the light source is selected from the group consisting of a laser, a diode, and a flashlamp.

12. The system of claim 1 wherein the photovoltaic cell is constructed from Si, Ge, GaAs, AlAs, InAs, AlP, InP, GaP, ZnSe, or CdSe, or combinations thereof.

* * * * *